United States Patent [19]
Mavis

[11] Patent Number: 6,094,066
[45] Date of Patent: Jul. 25, 2000

[54] TIERED ROUTING ARCHITECTURE FOR FIELD PROGRAMMABLE GATE ARRAYS

[75] Inventor: David G. Mavis, Albuquerque, N. Mex.

[73] Assignee: Mission Research Corporation, Albuquerque, N. Mex.

[21] Appl. No.: 09/128,986

[22] Filed: Aug. 3, 1996

[51] Int. Cl.$^7$ .............................................. H03K 19/177
[52] U.S. Cl. .................................................................. 326/41
[58] Field of Search ................................. 336/37, 39, 41, 336/47

[56] References Cited

U.S. PATENT DOCUMENTS

| | | | |
|---|---|---|---|
| 4,847,612 | 7/1989 | Kaplinsky | 326/39 |
| 5,376,844 | 12/1994 | Pedersen | 326/41 |
| 5,455,525 | 10/1995 | Ho et al. | 326/41 |
| 5,457,410 | 10/1995 | Ting | 326/41 |
| 5,469,003 | 11/1995 | Kean | 326/39 |
| 5,903,165 | 5/1999 | Jones et al. | 326/41 |

*Primary Examiner*—Jon Santamauro
*Attorney, Agent, or Firm*—Lee & Hayes, PLLC

[57] ABSTRACT

A field programmable gate array has multiple logic units interconnected via level-0 routing structure to form tier 0 logic tiles. The level-0 routing structure has horizontal wiring and vertical wiring that is interconnected via a horizontal-to-vertical directional routing switch that transfers signals from the horizontal wiring to the vertical wiring. The tier 0 logic tiles are nested within and interconnected by a level-1 routing structure to form tier 1 logic tiles. The level-1 routing structure has horizontal wiring and vertical wiring that is interconnected via a vertical-to-horizontal directional routing switch that transfers signals from the vertical wiring to the horizontal wiring. The level-0 routing structure is also interconnected to the level-1 routing structure via inter-level routing switches. Signals traveling between any two logic units within a common tier 0 logic tile traverse at most one directional routing switch within the level-0 routing structure. As a result, the path delay between any two logic units is approximately equal and independent of the placement of the logic units within the tier 0 logic tile. Signals traveling between any two logic units in different tier 0 logic tiles traverse at most one directional routing switch within the level-1 routing structure and two inter-level routing switches. The path delay between any two logic units in different tiles is also approximately equal and independent of the placement of the logic units within the different tier 0 logic tiles. Additionally, the routing delays throughout the FPGA are independent of fanout of the routing net and independent of the number of wires used for the net.

18 Claims, 8 Drawing Sheets

TIERED ROUTING ARCHITECTURE FOR FIELD PROGRAMMABLE GATE ARRAYS

GOVERNMENT CONTRACT

This invention was made with government support under government contract DSWA01-97-C-0107 awarded by Defense Special Weapons Agency. The government has certain rights in the invention.

TECHNICAL FIELD

This invention relates to field programmable gate arrays.

BACKGROUND

A field programmable gate array (FPGA) is an array of uncommitted logic elements formed in an integrated circuit chip (IC) that can be interconnected to implement various circuit functions. An FPGA can generally be described as having one or more logic elements and a routing structure that routes signals to and from the logic elements.

The architecture of an FPGA refers to both the structure of the logic element(s) and the structure of the programmable routing resource. The logic elements vary greatly in type depending upon the purpose and function of the FPGA device. The logic elements can be as simple as multiple arrays of two-input NAND gates or as complex as multiplexers or lookup tables.

The routing structure interconnects the logic elements. The routing structure includes I/O blocks, routing wires, and programmable routing switches that selectively interconnect the wires. Routing switches can be configured in several different ways including anti-fuses, EPROM transistors, EEPROM transistors, pass transistors or pass gates controlled by SRAM cells, and tri-stateable multiplexer switches controlled by SRAM cells or EEPROM transistors.

The inventor was tasked with developing an FPGA suitable for space-bound technologies, such as satellites, interplanetary probes, or manned space shuttles. To date, there are no commercial FPGAs being used in space without shielding for long missions. Space application presents a whole host of design issues for semiconductor technologies. One problem concerns the varying degrees of radiation that an FPGA might encounter when traveling through the Van Allen belts encircling the earth. Radiation tends to vary from a few krads to hundreds of krads. The radiation factor affects choice of logic elements. Pass gates, for example, are not a good choice for the space environment because the NMOS transistor is susceptible to leakage and cross talk problems.

The inventor examined conventional FPGA architectures to determine whether they would be effective in space. FIGS. 1–4 show block representations of four generic classes of FPGA architectures. In all conventional architectures, the routing structure depends on the layout of the logic elements. The wires occupying the routing channels are generally straight segments (sometimes of varying lengths) that can be interconnected to form longer segments and connected to orthogonal wires to change direction.

FIG. 1 shows a symmetrical array architecture 20 having multiple logic elements 22 interconnected by vertical and horizontal wiring channels 24. In this architecture, the logic elements are separated from one another by the routing structure.

FIG. 2 shows a row-based architecture 30 having rows of logic elements 22 and primary wiring channels 24 running in parallel between the logic elements. There are additional wires (not shown) running transversely to the wiring channels 24 to connect to the logic elements.

FIG. 3 shows a conventional sea-of-gates architecture 40, in which the routing structure 24 overlays the logic elements 22.

FIG. 4 shows a hierarchical architecture 50 having local interconnects for connections to logic elements and global interconnects to route signals between blocks of logic elements.

The routing structure makes up the majority of the FPGA device. For example, conventional FPGAs consist of approximately 80% routing structure and 20% logic elements. Accordingly, only a small fraction of the FPGA is used to compute logic functions, while the majority of the FPGA is dedicated to routing signals to and from the logic elements. The proportionally larger routing structure enables broad adaptability and flexibility of the FPGA during programming.

However, to achieve greater logic functionality without increasing device size, it would be beneficial to increase the proportion of logic circuitry relative to routing structure on conventional FPGA devices.

Another drawback with conventional FPGA architectures is that routing delays between logic elements is dependent on many factors, including fanout (i.e., a wire net in which the output of one logic element drives multiple inputs of other logic elements), number of routing switches, and the location of the logic elements. To achieve high versatility, conventional FPGAs employ a large number of programmable routing switches. Signal paths from any two logic elements may be routed through various numbers of switches. As a result, path delays experienced by signals are typically different; that is, path delays differ for each logic element-to-logic element interconnect. The path delays cannot be determined until the designer has established where the logic elements are located and the final routing pattern used to interconnect the logic elements. Then, and only then, are the timing delays determinable.

It would be beneficial to devise an FPGA architecture in which path delays between any two logic elements is independent of location within the FPGA and fanout.

Although the inventor's quest began by contemplating use of FPGAs in space, the inventor has developed an FPGA routing architecture that broadly applies to all forms of FPGA devices, including special devices designed for space and commercial devices.

SUMMARY

This invention concerns a tiered FPGA architecture that enables a designer to define nestable levels of routing structures. Logical units are interconnected at the lowest tier routing structure to form low level logic tiles, and these low level logic tiles can be nested in higher level routing structures to form higher level logic tiles.

According to one implementation, a field programmable gate array has multiple logic units interconnected via level-0 routing structure to form tier 0 logic tiles. The level-0 routing structure has horizontal wiring and vertical wiring interconnected via a horizontal-to-vertical directional routing switch that transfers signals from the horizontal wiring to the vertical wiring.

The tier 0 logic tiles are nested within and interconnected by a level-1 routing structure to form tier 1 logic tiles. The level-1 routing structure has horizontal wiring and vertical wiring interconnected via a vertical-to-horizontal directional routing switch that transfers signals from the vertical wiring to the horizontal wiring. The level-0 routing structure is also interconnected to the level-1 routing structure via inter-level routing switches.

Signals traveling between any two logic units within a common tier 0 logic tile traverse at most one directional routing switch within the level-0 routing structure. As a result, the path delay between any two logic units in a tier 0 logic tile is approximately equal and independent of the placement of the logic units within the tier 0 logic tile. Signals traveling between any two logic units in different tier 0 logic tiles traverse at most one directional routing switch within the level-1 routing structure and two inter-level routing switches. The path delay between any two logic units in different tier 0 logic tiles is also approximately equal and independent of the placement of the logic units within the different tier 0 logic tiles.

The architecture is extensible to any number of tiers, with each successively lower tier logic tile being nested within the next level routing structure. Once the size of the tiered structure exceeds the space of one IC chip, the architecture extends to interfacing multiple IC chips using the next level of routing structure.

Due to the nestable, tiered routing architecture, routing delays are determinable at the design phase and independent of the physical layout of the logic units within the chip. All routing circuitry between logic elements within the same tier have the same delay. All routing circuitry between logic elements in successively higher tiers also experience the same delay, albeit a different delay than the same-tier delay. Additionally, the routing delays are independent of fanout of the routing net and independent of the number of wires used for the net.

DETAILED DESCRIPTION

This invention is directed to a tiered FPGA architecture that affords high routing flexibility. The tiered architecture allows a designer to create various levels of routing structure used to interconnect logic units. The logical units are connected to the lowest level routing structure to form low tier logic tiles. These low tier logic tiles can then be nested within successively higher level routing structures to form higher tier logic tiles.

The nestable, tiered routing architecture provides many significant benefits. One benefit is that routing delays associated with any given signal does not depend on the placement of logic elements within the array. All routing circuitry between logic elements within the same tier have the same delay. All routing circuitry between logic elements in different tiers experience the same delay, albeit a different delay than the same-tier delay. Another significant advantage is that the routing delays are independent of fanout of the routing net and independent of the number of wires used for the net.

Figure 1:
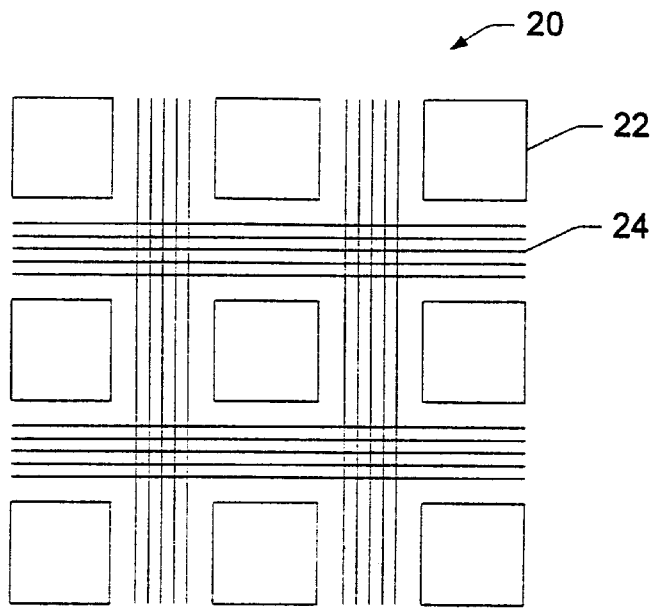
FIG. 1 is a diagrammatic illustration of a conventional array FPGA architecture.
Figure 2:
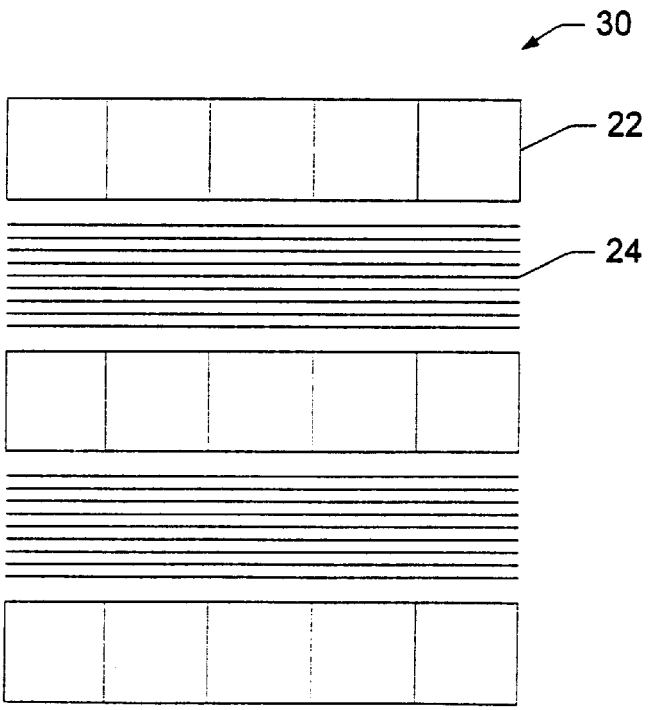
FIG. 2 is a diagrammatic illustration of a conventional row-based FPGA architecture.
Figure 3:
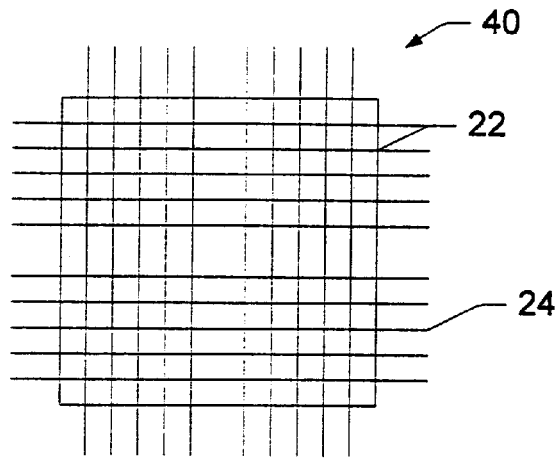
FIG. 3 is a diagrammatic illustration of a conventional sea-of-gates FPGA architecture.
Figure 4:
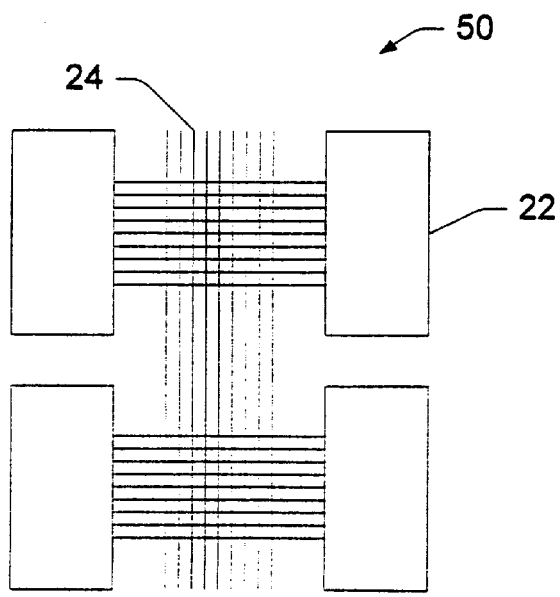
FIG. 4 is a diagrammatic illustration of a conventional hierarchical FPGA architecture.
Figure 5:
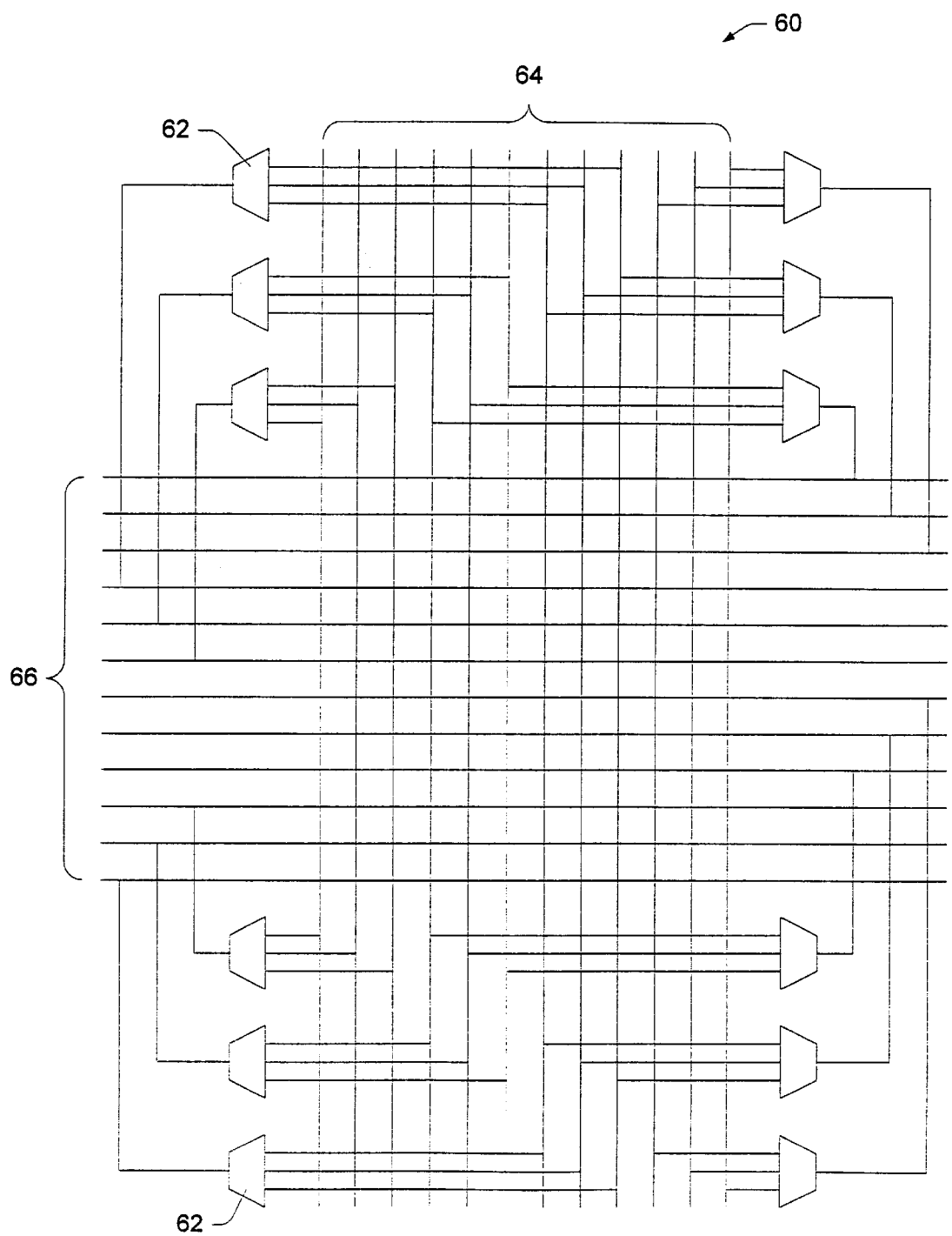
FIG. 5 is a wiring diagram of a routing switch block used in routing structures.

The routing structure of an FPGA comprises sets of orthogonal wires that are selectively interconnected via routing switches. FIG. 5 shows one example of a routing switch block 60 used in the routing structure to interconnect the wires. In this example, the switch block 60 is a directional switch block implemented with tri-stateable multiplexers 62. The directional switch block 60 has vertical wires 64 and horizontal wires 66. Inputs to the multiplexers 62 are connected to the vertical wires 64 and outputs from the multiplexers 62 are connected to the horizontal wires 66. With this interconnect construction, the directional switch block 60 is referred to as a vertical-to-horizontal switch block.

Although multiplexers are shown in the exemplary switch block 60, other types of routing switches may be employed. Examples of other switches include one-time programmable switches (e.g., antifuses), NMOS pass gates, PMOS/NMOS transmission gates, EPROM transistors, and EEPROM transistors.

Figure 6:
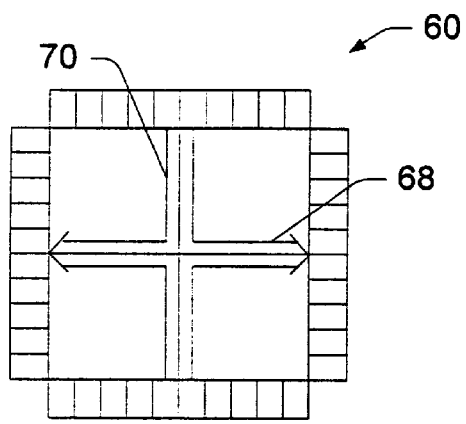
FIG. 6 is a symbol representation of the FIG. 5 routing switch block.

FIG. 6 shows a symbol representation of the switch block 60. The switch block symbol has a horizontal bar 68 with arrowheads at opposing ends to indicate that the horizontal wires carry output signals from the multiplexers, and the vertical bar 70 without arrowheads to indicate that the vertical wires carry input signals to the multiplexers.

An alternative switch construction is to connect the inputs of the multiplexers 62 to the horizontal wires 66 and the outputs of the multiplexers 62 to the vertical wires 64. In this case, the horizontal wires carry the input signals to the multiplexers 62 and the vertical wires carry the output signals from the multiplexers 62. The corresponding symbol has arrowheads on the vertical bar and no arrowheads on the horizontal bar.

Figure 7:
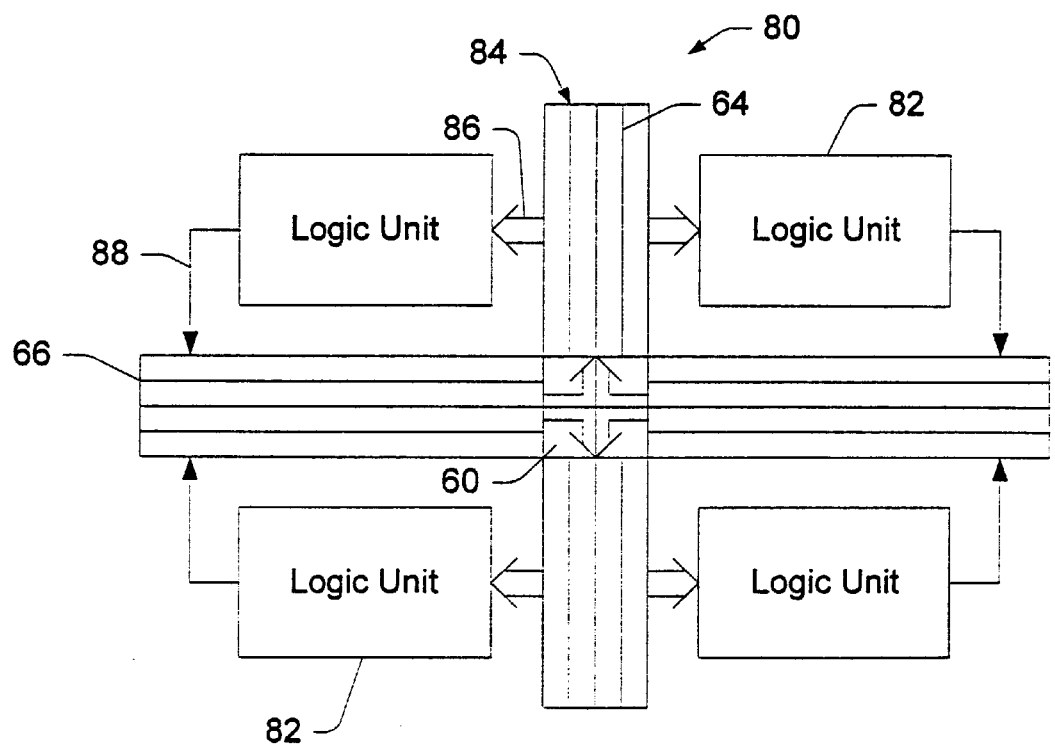
FIG. 7 is a diagrammatic illustration of a tier 0 logic tile having four logic units interfaced to a tier 0 routing structure.
Figure 8:
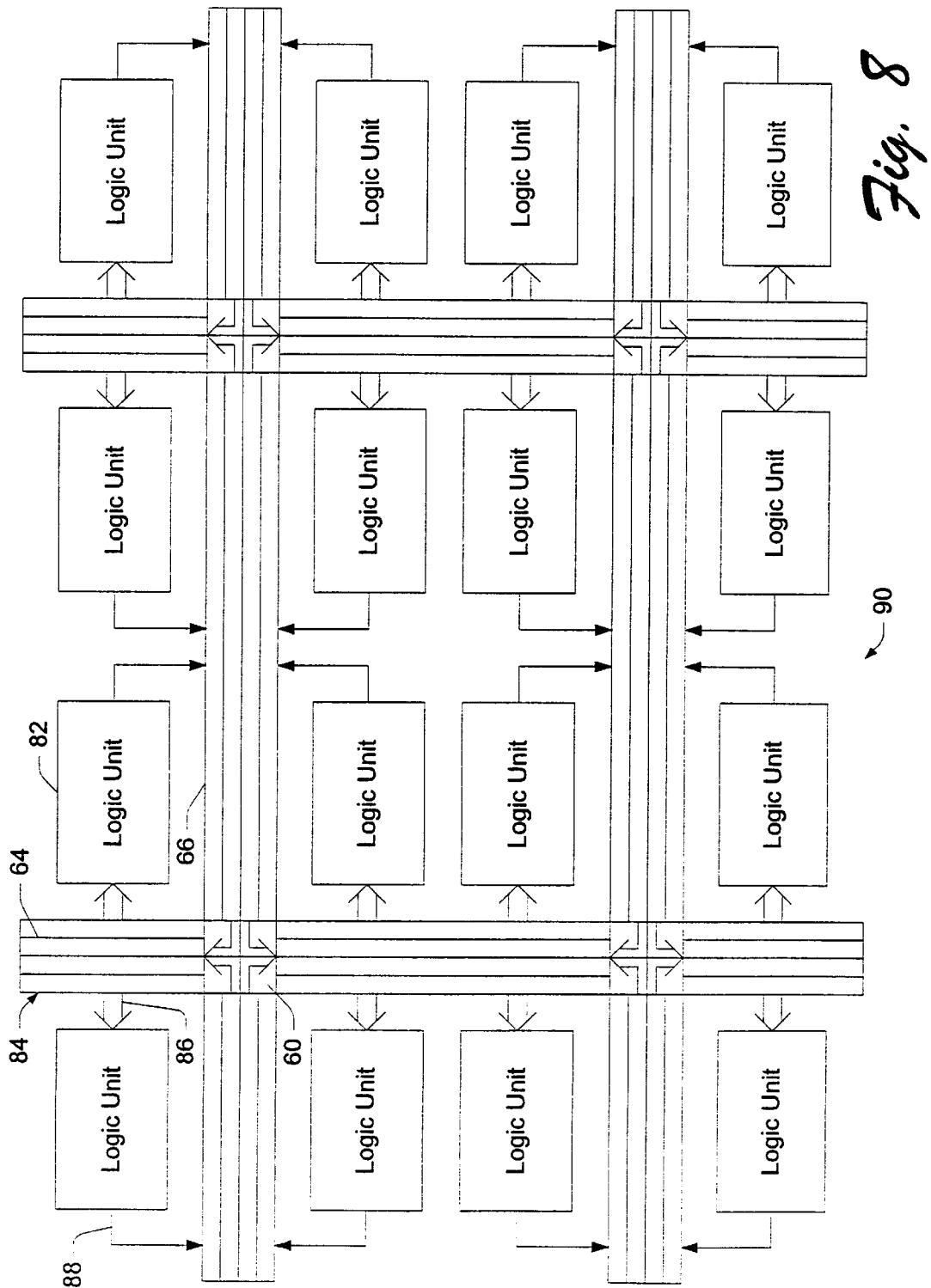
FIG. 8 is a diagrammatic illustration of a tier 0 logic tile having sixteen logic units interfaced to the level 0 routing structure.

According to the tiered routing architecture, different tiers can be established to route signals efficiently among the various logic units. The lowest tier is tier 0, or "T0", with the next highest tier being tier 1, or "T1", and so on. At tier 0, the logic units are interfaced with a level 0 routing structure. FIGS. 7 and 8 show two examples of different sized T0 logic tiles.

FIG. 7 shows a tier 0 (T0) logic tile 80 having four logic units (LU) 82 interfaced to a level-0 routing structure 84. The logic units 82 perform the logic functions of the FPGA and can be implemented as any type of logic, including logic gates (AND, OR, NAND, NOR), multiplexers, and lookup tables.

The logic units 82 have inputs 86 coupled to the vertical wires 64 of the level-0 routing structure 84 and outputs 88 coupled to the horizontal wires 66. A directional switch block 60 interconnects the vertical and horizontal wires such that signals carried by the horizontal wires 66 are input to the switches (e.g., multiplexers) of the switch block and signals carried by the vertical wires 64 are output from the switches.

FIG. 8 shows a T0 logic tile 90 having sixteen logic units 82 interfaced to the level-0 routing structure 84. As with the 4-LU tile 80, the logic units 82 in the 16-LU tile 90 have inputs 86 coupled to the vertical wires 64 of the level-0 routing structure 84 and outputs 88 coupled to the horizontal wires 66. Directional switch blocks 60 interconnect the vertical and horizontal wires such that signals carried by the horizontal wires are input to the switches and signals carried by the vertical wires are output from the switches.

In the illustrated implementation, the outputs 88 are hardwired into the horizontal wires 66 of the level-0 routing structure 84, rather than using switches. This eliminates the number of switches in the FPGA routing structure and reduces expenses and complexity during manufacturing. In some cases, the tiered routing architecture has just one-fourth the number of switches of comparable commercial FPGAs.

This dramatic reduction in routing switches leads to significant advantages. Signals traveling between logic units 82 within the level-0 routing structure 84 go through only one routing switch block 60 to transition between horizontal and vertical wires. As a result, the path delay between any two logic units 82 is approximately equal, independent of where the two logic units are physically located within the tier 0 logic tile. Moreover, path delays are independent of fanout. That is, the output of one logic unit can drive any number of inputs of other logic units without affecting path delays or performance. This is because the capacitive loads represented by the wires are independent of how many switches are deriving their inputs from the wires.

Another advantage is that a greater percentage of the FPGA can be dedicated to logic circuitry. With fewer switches, the routing structure can be made smaller, thereby freeing chip space for more logic circuitry. Despite the tremendous reduction in switches, however, the routing architecture is extremely versatile as the fewer number of switches has little to no affect on programming-time flexibility.

Figure 9:
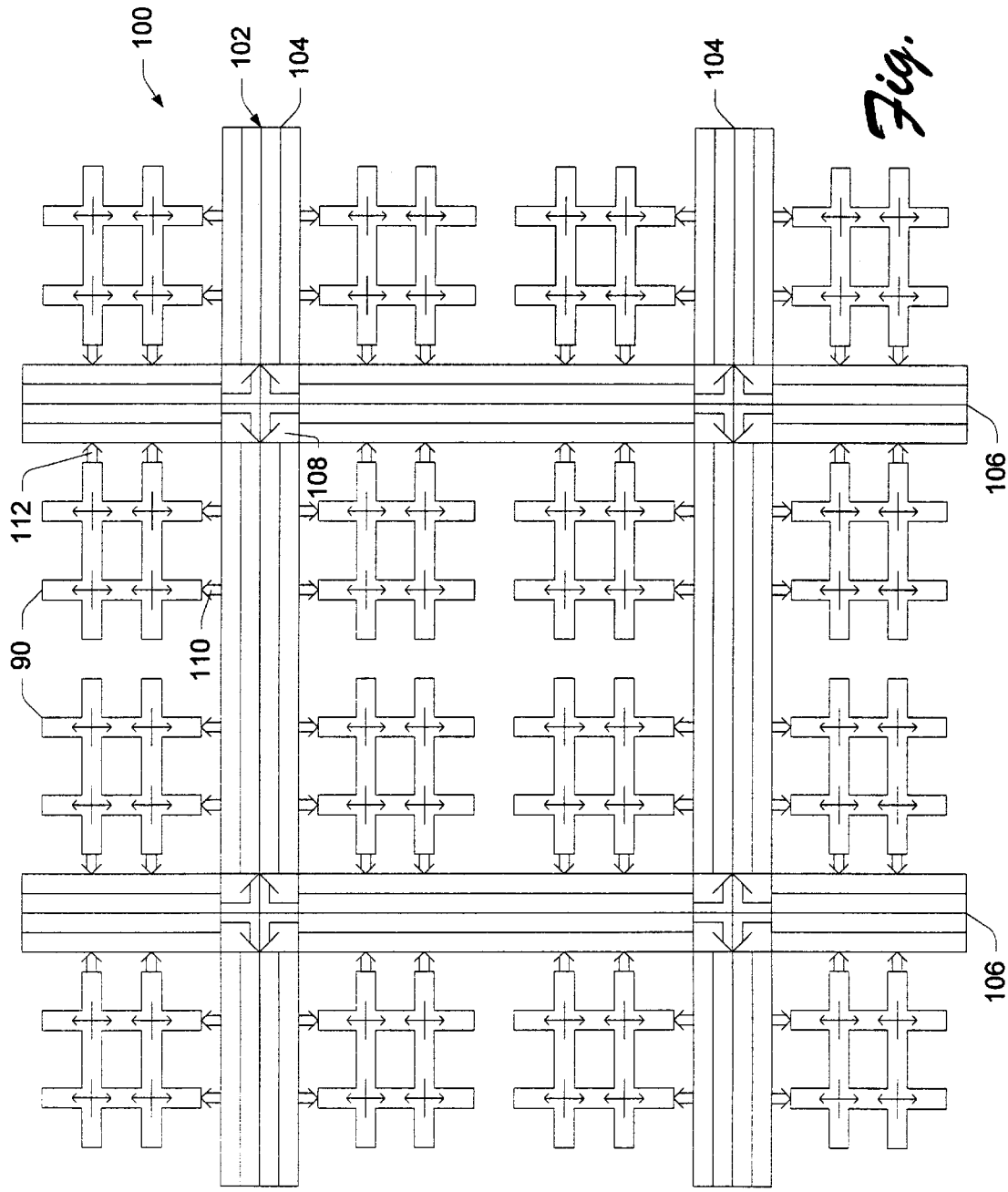
FIG. 9 is a diagrammatic illustration of a tier 1 logic tile having sixteen tier 0 logic tiles interfaced to a level 1 routing structure.

According to the nestable nature of the routing architecture, the T0 logic tiles can be nested within and interfaced to a level-1 routing structure. FIG. 9 shows a T1 logic tile 100 having sixteen T0 logic tiles 90 interfaced to a level-1 routing structure 102. The T0 logic tiles 90 are represented in FIG. 9 by the crossed pairs of horizontal and vertical wire channels, as shown FIG. 8. The logic units are not illustrated in FIG. 9.

The vertical wires in the level-0 routing structure of the T0 logic tiles 90 are connected via inter-level routing switches (represented by the input arrow 110) to receive signals from the horizontal wires 104 of the level-1 routing structure 102. The horizontal wires in the level-0 routing structure of the T0 logic tiles 90 are connected via inter-level routing switches (represented by the output arrow 112) to output signals onto vertical wires 106 of the level-1 routing structure 102.

Routing switch blocks 108 interconnect the vertical and horizontal wires of the level-1 routing structure 102 such that signals carried by the vertical wires 106 are input to the switch block and signals carried the horizontal wires 104 are output by the switch block. Notice that the switch blocks 108 in the T1 logic tile 100 are constructed in the alternative form from switch blocks 60 in the T1 logic tile 90. That is, switch blocks 60 are horizontal-to-vertical switches and switch blocks 108 are vertical-to-horizontal switches. The direction of the switch blocks alternates with each successively higher tier.

As noted above, the inputs/outputs of the level-0 wires are connected into the level-1 wires through inter-level switches. This leads to another significant benefit. Signals traveling between any two T0 logic tiles 90 traverse a path with determinable delay. The signals go through only one routing switch block 108 to transition between the vertical and horizontal wires in the level-1 routing structure 102 and two inter-level routing switches to transition between level-0 and level-1. As a result, the path delay between any two T0 logic tiles 90, regardless of their programmed placement, is approximately the same.

Furthermore, another benefit is that the path delay between any two logic units over both the T0 and T1 routing structures is approximately the same. The signals traveling between any two logic units located in different T0 logic tiles traverse at most three routing switch blocks in the level-0 and level-1 routing structures: two inter-level switches between the level-0 and level-1 routing structures and one directional routing switch at the level-1 routing structure.

Figure 10:
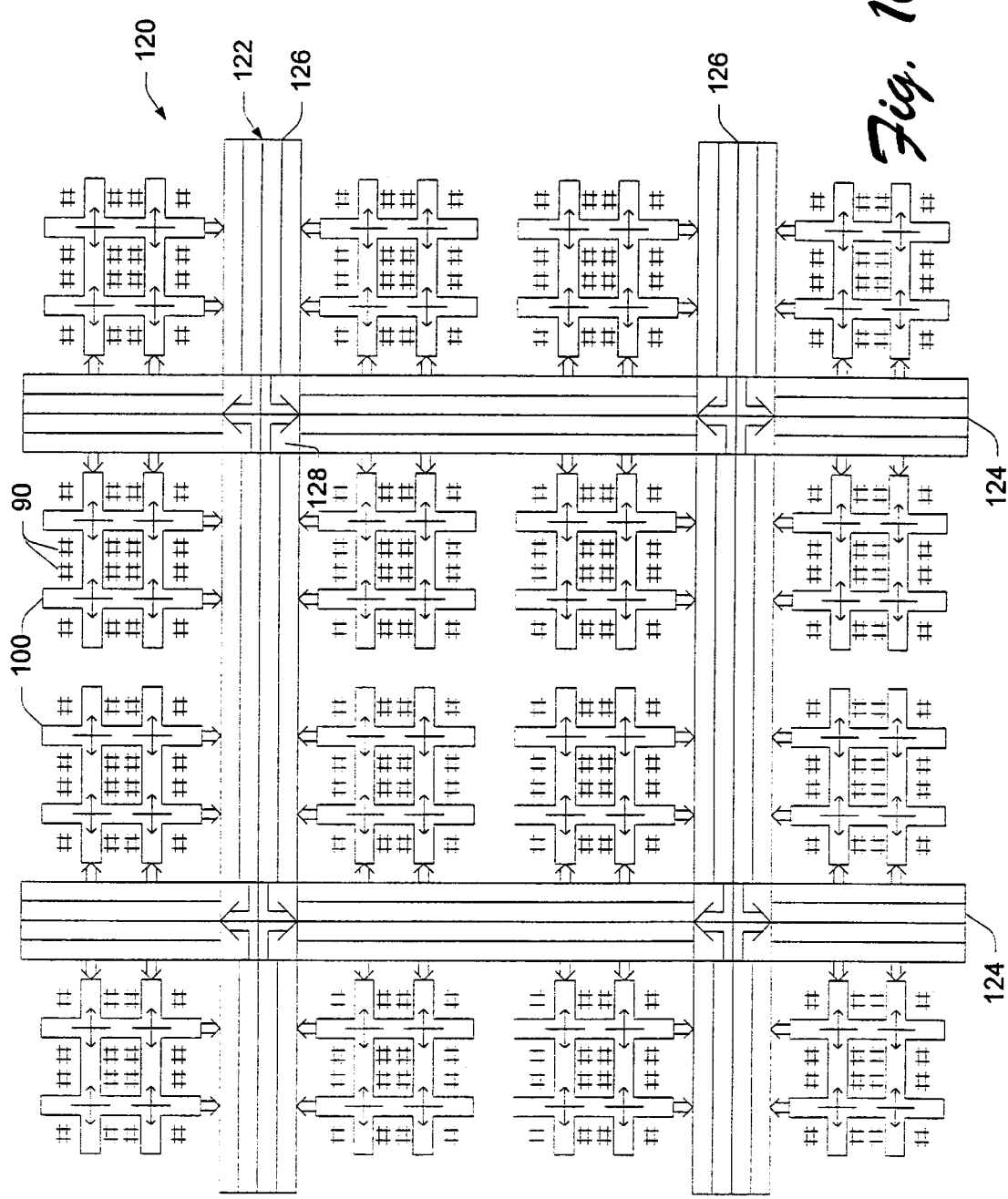
FIG. 10 is a diagrammatic illustration of a tier 2 logic tile having sixteen tier 1 logic tiles interfaced to a level 2 routing structure.

FIG. 10 shows a T2 logic tile 120 having sixteen T1 logic tiles 100 interfaced to level-2 routing structure 122. The T1 logic tiles 100 are represented by the crossed pairs of horizontal and vertical wire channels and the T0 logic tiles 90 are represented by a "#" symbol. The logic units are not illustrated in FIG. 10.

The horizontal wires in the level-1 routing structure of the T1 logic tiles 100 are connected via inter-level routing switches to receive signals from the vertical wires 124 of the level-2 routing structure 122. The vertical wires in the level-1 routing structure of the T1 logic tiles 100 are connected via inter-level routing switches to output signals onto horizontal wires 126 of the level-2 routing structure 122.

Switch blocks 128 interconnect the vertical and horizontal wires of the level-2 routing structure 122. As noted above, the switch blocks 128 in tier 2 are horizontal-to-vertical switch blocks like switch blocks 60 in tier 0, but opposite than the vertical-to-horizontal switch blocks 108 in tier 1.

The inputs/outputs of the level-1 wires are connected into the level-2 wires. Signals traveling between T1 logic tiles 100 go through one routing switch block 128 to transition between vertical and horizontal wires in the level-2 routing structure and four inter-level routing switches to traverse from level-0 to level-1 and from level-1 to level-2 and then back again. As a result, the path delay between any two T1 logic tiles 100, regardless of programmed position, is approximately the same.

The path delay between any two logic units over all three T0, T1, and T2 routing structures is approximately the same. The signals traveling between any two logic units located in different T0 logic tiles traverse at most five routing switch blocks in the level-0, level-1, and level-2 routing structures: four inter-level switches between the three routing structures and one directional routing switch at the level-2 routing structure.

As demonstrated, the tiered architecture of this invention renders path delays between any two logic units independent of the placement of those logic units. The path delays are dependent only upon the number of routing structure levels that a signal traverses when traveling from one logic unit to another. The path delays between any two logic units (LU)

for travel over one or more routing structure levels can be represented as follows:

T0 Path: LU <S> H0 <S> V0 <S> LU

T0–T1 Path: LU <S> H0 <S> V1 <S> H1 <S> V0 <S> LU

T0–T2 Path: LU <S> H0 <S> V1 <S> H2 <S> V2 <S> H1 <S> V0 <S> LU

The notation "H0" represents a horizontal wiring channel on the level 0 routing structure and the notation "V1" represents a vertical wiring channel on the level 1 routing structure. The notation "<S>" represents a routing switch. Notice that there is only one directional routing switch for traversing between horizontal and vertical wires within the same level routing structure, and only one inter-level routing switch between each successive routing structure when traversing from one level to the next. For example, in the T0 path, a signal traverses one directional switch between the horizontal wires H0 and the vertical wires V0. In a T0/T1 path, a signal traverses one inter-level switch between the level-0 horizontal wires H0 and the level-1 vertical wires V1, one directional switch between the level-1 vertical wires V1 and the level-1 horizontal wires H1, and one inter-level switch between the level-1 horizontal wires H1 and the level-0 vertical wires V0.

The above path representations also show switches between the logic units LU and level-0 routing structures. In some implementations, the switch between the source logic unit and the level-0 wires may be removed if the logic unit is configured to directly drive the level-0 wires. This optimization further reduces the number of switches in the FPGA.

From the above path representations, the maximum number of switches for any signal traveling between two logic units is equal to summing the number of switches interconnecting the logic units with the level-0 routing structure, the number of inter-level switches, and the one directional switch. For example, any signal traversing a T0 path encounters two switches between the logic units and the level-0 routing structure and at most one routing switch within the level-0 routing structure, resulting in a total of three switches. Any signal traversing a T0/T1 path encounters the two switches between the logic units and the level-0 routing structure and at most three routing switches within the level-0 and level-1 routing structures: two inter-level switches and one directional switch. This yields a total of five switches. Any signal traversing a T0/T1/T2 path encounters the two switches between the logic units and the level-0 routing structure and at most five routing switches within the level-0, level-1, and level-2 routing structures: four inter-level switches and one directional switch. This produces a total of seven switches.

The number of tiers for a given FPGA chip is determined from the desired size. Generally, larger FPGA chips have more tiers than smaller FPGA chips. As an example, a 4K–10K FPGA can be efficiently implemented using two tiers, whereas a 10K–64K FPGA can be efficiently implemented using three tiers.

Figure 11:
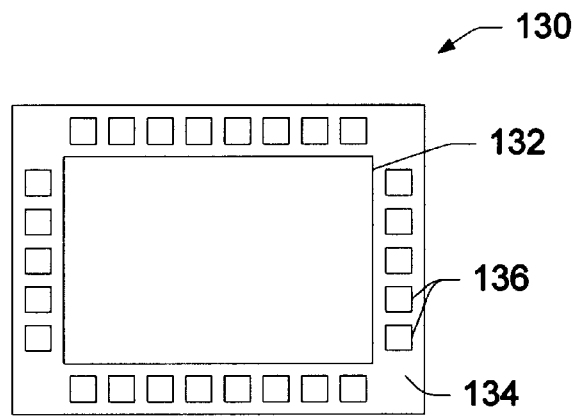
FIG. 11 is a diagrammatic illustration of a FPGA integrated circuit chip having a tiered core and peripheral I/O buffers.

FIG. 11 shows an FPGA chip 130 having a core 132 of nested tiers and a periphery 134. I/O buffers 136 are located on the periphery 134 surrounding the core 132. Each I/O buffer 136 is bidirectional and programmed to be either an input or an output. Input buffers drive directly the level-1 routing structure in the core 132. Output buffers receive their signals directly from the level-1 routing structure in the core 132. Buffers on the left and right sides of the IC device are bidirectionally connected to the level-1 horizontal channels, whereas buffers on the top and bottom sides of the IC device will be bidirectionally connected to the level 1 vertical channels.

The buffers may also be coupled directly to corresponding ones of the peripheral logic units. There are a number of peripheral logic units that line the periphery 134 of the IC device 130. As an example, the core 132 might consist of a T2 logic tile 120 in FIG. 10, which has 60 peripheral logic units.

The tiered routing architecture is extensible to any number of tiers, with each successively lower tier being nested within the next higher tier and interfaced to the next level routing structure. Once the size of the tiered structure exceeds the space of one IC chip, the architecture extends to interfacing multiple IC chips using the next level of routing structure.

Figure 12:
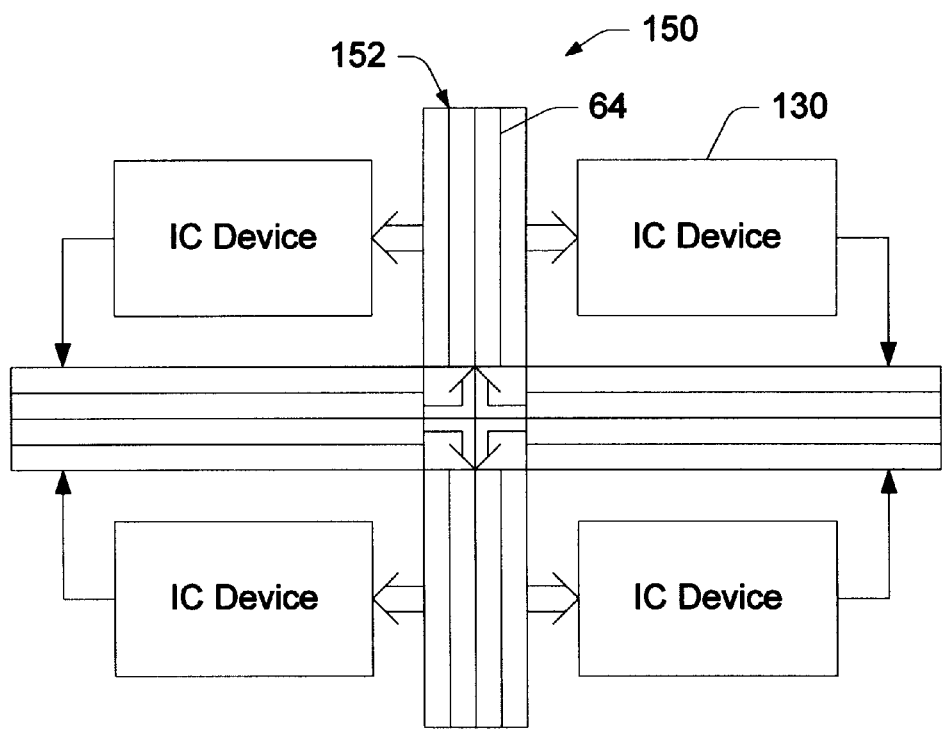
FIG. 12 is a diagrammatic illustration of a multi-chip FPGA module having four tier 2 logic chips interfaced to a level 3 routing structure.

FIG. 12 shows a T3 multi-chip module (MCM) 150 having four chips 130 interfaced to level-3 routing structure 152. Each IC device 130 comprises a T2 logic tile 120. A unique benefit of the tiered architecture is that the principles of path delay and fanout independence are maintained even in expansion to multi-chip construction. The path delay between any two logic units (even on separate chips), remains independent of the placement of those logic units. The path delays depend only upon the number of routing structure levels that a signal traverses when traveling from one logic unit to another. Thus, a signal traveling between any two logic units on two different chips 120 experiences approximately the same delay.

The tiered routing architecture provides many advantages. First, path delay is independent of the logic unit programmed placement. The routing delay of any given net depends only on whether an interconnect is accomplished through the level-0 routing structure or whether higher level (i.e., tier 1 and tier 2) routing structures are used for longer routes. Second, large fanout nets do not necessarily consume large amounts of routing resources. For example, the source logic unit can be configured to drive a single vertical line and the multiple target logic units can have their inputs coupled to a single horizontal line, which is driven by the single vertical line. Also, these delays are independent of fanout of the net and independent of the number of wires used for routing the net.

Invariance of the path delay to the details of the final routing allows an FPGA user to verify the timing performance of his design immediately after synthesis and before the final place and route. For example, a pre-route software tool can pre-allocate closely associated logic units to the same tier logic tile and interconnect the tiles as needed. Once this is done, the timing of the entire FPGA is known and the results can be back annotated into the logic net list for electrical simulation. The final place and route tool can then reorganize logic unit placements within each tile and optimize tile placements over the FPGA without changing any of the net timings. This is a significant advantage over prior art architectures, in which routing delays cannot be established until the FPGA is finally routed.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A field programmable gate array comprising:
   multiple tier 0 (T0) logic tiles, each T0 logic tile comprising:
   (i) multiple logic units;
   (ii) a level-0 routing structure coupled to carry signals to and from the logic units;

a level-1 routing structure coupled to carry signals to and from the T0 logic tiles, the level-1 routing structure having wires interconnected via directional switch blocks; and wherein path delays between any two of the logic units within a common T0 logic tile is approximately equal and path delays between any two of the logic units located in different T0 logic tiles is approximately equal.

2. A field programmable gate array as recited in claim 1, wherein the T0 logic tiles and the level-1 routing structure are integrated on a single integrated circuit chip, and further comprising:

multiple ones of the integrated circuit chips; and an inter-chip routing structure coupled to carry signals to and from the integrated circuit chips.

3. A field programmable gate array as recited in claim 1, wherein the T0 logic tiles and the level-1 routing structure form a tier 1 (T1) logic tile, further comprising a level-2 routing structure coupled to carry signals to and from multiple ones of the T1 logic tiles, wherein path delays between any two of the logic units located in different T0 logic tiles and separated by the level-1 and level-2 routing structures is approximately equal.

4. A field programmable gate array as recited in claim 3, wherein the T1 logic tiles and the level-2 routing structure are integrated on a single integrated circuit chip, and further comprising:

multiple ones of the integrated circuit chips; and an inter-chip routing structure coupled to carry signals to and from the integrated circuit chips.

5. A field programmable gate array as recited in claim 1, wherein the T0 logic tiles and the level-1 routing structure are integrated into a core on a single integrated circuit chip, and further comprising I/O buffers aligned on the integrated circuit chip around a periphery of the core and interconnected to the level-1 routing structure.

6. A field programmable gate array comprising:

multiple tier zero (T0) logic tiles, each T0 logic tile comprising:
(i) multiple logic units;
(ii) a level-0 routing structure coupled to carry signals to and from the logic units, the level-0 routing structure comprising first and second sets of wires interconnected via a routing switch block;

a level-1 routing structure coupled to carry signals to and from the T0 logic tiles, the level-1 routing structure comprising third and fourth sets of wires interconnected via a directional routing switch block; and wherein signals traveling between any two of the logic units within a common T0 logic tile traverse at most one routing switch block in the level-0 routing structure and signals traveling between any two logic units located in different T0 logic tiles traverse at most three routing switch blocks in the level-0 and level-1 routing structures.

7. A field programmable gate array as recited in claim 6, wherein the T0 logic tiles and the level-1 routing structure form a tier one (T1) logic tile, further comprising a level-2 routing structure coupled to carry signals to and from multiple ones of the T1 logic tiles, wherein signals traveling between any two logic units located in different T1 logic tiles traverse at most five routing switch blocks in the level-0, level-1, and level-2 routing structures.

8. A field programmable gate array as recited in claim 6, wherein the T0 tiles and the level-1 routing structure are integrated on a single integrated circuit chip, and further comprising:

multiple ones of the integrated circuit chips; and an inter-chip routing structure coupled to carry signals to and from the integrated circuit chips.

9. A field programmable gate array as recited in claim 6, wherein the T0 logic tiles and the level-1 routing structure are integrated into a core on a single integrated circuit chip, and further comprising I/O buffers aligned on the integrated circuit chip around a periphery of the core and interconnected to the level-1 routing structure.

10. A field programmable gate array comprising:

multiple logic units, each logic unit having one or more inputs and one or more outputs;

a level-0 routing structure coupled to the inputs and outputs of the logic units, the level-0 routing structure having horizontal wiring and vertical wiring interconnected via a level-0 directional routing switch of a first direction that transfers signals either (1) from the horizontal wiring to the vertical wiring or (2) from the vertical wiring to the horizontal wiring so that the signals are transferred from selected outputs of the logic units to selected inputs of the logic units;

a level-1 routing structure coupled to the level-0 routing structure, the level-1 routing structure having horizontal wiring and vertical wiring interconnected via a level-1 directional routing switch of a second direction opposite than the first direction to transfer signals either (1) from the vertical wiring to the horizontal wiring or (2) from the horizontal wiring to the vertical wiring;

the vertical wiring of the level-0 routing structure connecting to the horizontal wiring of the level-1 routing structure via an inter-level routing switch and the horizontal wiring of the level-0 routing structure connecting to the vertical wiring of the level-1 routing structure via another inter-level routing switch;

wherein signals traveling from any two logic units within the level-0 routing structure transfer between the horizontal and vertical wirings at most one time via the level-0 directional routing switch; and wherein signals traveling from any two logic units via the level-0 and level-1 routing structures traverse at most the two inter-level routing switches and the level-1 directional routing switch.

11. A field programmable gate array as recited in claim 10, wherein the logic units, level-0 routing structure, and the level-1 routing structure are integrated on a single integrated circuit chip, and further comprising:

multiple ones of the integrated circuit chips; and an inter-chip routing structure coupled to carry signals to and from the integrated circuit chips.

12. A field programmable gate array as recited in claim 10, wherein the logic units and the level-1 routing structure are integrated into a core on a single integrated circuit chip, and further comprising I/O buffers aligned on the integrated circuit chip around a periphery of the core and interconnected to the level-1 routing structure.

13. A field programmable gate array as recited in claim 10, further comprising a level-2 routing structure coupled to level-1 routing structure, the level-2 routing structure having horizontal wiring and vertical wiring interconnected via a level-2 directional routing switch of the first direction, the vertical wiring of the level-1 routing structure connecting to the horizontal wiring of the level-2 routing structure via an inter-level routing switch and the horizontal wiring of the level-1 routing structure connecting to the vertical wiring of the level-2 routing structure via another inter-level routing switch, wherein signals traveling from any two logic units via the level-0, level-1, and level-2 routing structures traverse at most four of the inter-level routing switches and the level-2 directional routing switch.

14. A field programmable gate array as recited in claim 13, wherein the logic units, level-0 routing structure, the level-1 routing structure, and the level-2 routing structure are integrated on a single integrated circuit chip, and further comprising:

multiple ones of the integrated circuit chips; and an inter-chip routing structure coupled to carry signals to and from the integrated circuit chips.

15. A field programmable gate array as recited in claim 13, wherein the logic units, the level-1 routing structure, and the level-2 routing structure are integrated into a core on a single integrated circuit chip, and further comprising I/O buffers aligned on the integrated circuit chip around a periphery of the core and interconnected to the level-2 routing structure.

16. A field programmable gate array as recited in claim 10, wherein the routing switch blocks comprise directional routing switches constructed using multiplexers.

17. A field programmable gate array comprising multiple logic units interconnected via level-0 routing structure to form tier 0 logic tiles, the level-0 routing structure having sets of level-0 wiring and directional routing switches interconnecting the sets of level-0 wiring, the tier 0 logic tiles being nested within and interconnected to a level-1 routing structure to form tier 1 logic tiles, the level-1 routing structure having sets of level-1 wiring and directional switches interconnecting the sets of level-1 wiring, wherein signals traveling between any two logic units within a common tier 0 logic tile traverse at most one directional routing switch within the level-0 routing structure and signals traveling between any two logic units in different tier 0 logic tiles traverse at most one directional routing switch within the level-1 routing structure.

18. A field programmable gate array as recited in claim 17, wherein the directional routing switch blocks are constructed using multiplexers.

* * * * *